(12) United States Patent
Oukassi et al.

(10) Patent No.: US 11,581,139 B2
(45) Date of Patent: Feb. 14, 2023

(54) INTEGRATED ENERGY STORAGE COMPONENT

(71) Applicants: Murata Manufacturing Co., Ltd., Nagaokakyo (JP); COMMISSARIAT A L'ENERGIE ATOMIQUE ET AUX ENERGIES ALTERNATIVES, Paris (FR)

(72) Inventors: Sami Oukassi, Paris (FR); Raphaël Salot, Paris (FR); Frédéric Voiron, Barraux (FR); Valentin Sallaz, Cran-Gevrier (FR)

(73) Assignees: MURATA MANUFACTURING CO., LTD., Nagaokakyo (JP); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 129 days.

(21) Appl. No.: 16/951,353

(22) Filed: Nov. 18, 2020

(65) Prior Publication Data
US 2021/0074477 A1 Mar. 11, 2021

Related U.S. Application Data

(63) Continuation of application No. PCT/EP2019/062230, filed on May 13, 2019.

(30) Foreign Application Priority Data

May 18, 2018 (EP) .................................. 18305624

(51) Int. Cl.
*H01G 4/10* (2006.01)
*H01G 11/26* (2013.01)
(Continued)

(52) U.S. Cl.
CPC ............... *H01G 4/10* (2013.01); *H01G 11/26* (2013.01); *H01G 11/46* (2013.01); *H01G 11/56* (2013.01); *H01G 11/70* (2013.01)

(58) Field of Classification Search
CPC ........ H01G 11/26; H01G 11/46; H01G 11/56; H01G 11/04; H01G 11/70
See application file for complete search history.

(56) References Cited

U.S. PATENT DOCUMENTS 6,261,895 B1    7/2001  Adkisson et al.
8,339,768 B2   12/2012  Park et al.
(Continued)

FOREIGN PATENT DOCUMENTS

EP          2393090 A1    12/2011
WO     2010093761 A1     8/2010

OTHER PUBLICATIONS

Chanyuan Liu, et al.; "An all-in-one nanopore battery array"; Nature Nanotechnology, vol. 9, Dec. 2014, pp. 1031-1039.
(Continued)

*Primary Examiner* — Eric W Thomas
(74) *Attorney, Agent, or Firm* — ArentFox Schiff LLP

(57) ABSTRACT

An integrated energy storage component that includes a substrate supporting a contoured layer having a region with a contoured surface such as elongated pores. A stack structure is provided conformally over the contoured surface of this region. The stack is a single or repeated instance of MOIM layers, or MIOM layers, the M layers being metal layers, or a quasi-metal such as TiN, the O layers being oxide layers containing ions, and the I layer being an ionic dielectric. The regions having a contoured surface may be formed of porous anodized alumina.

24 Claims, 4 Drawing Sheets

(51) Int. Cl.
*H01G 11/46* (2013.01)
*H01G 11/56* (2013.01)
*H01G 11/70* (2013.01)

(56) References Cited

U.S. PATENT DOCUMENTS

| | | |
|---|---|---|
| 8,830,656 B2 | 9/2014 | Besling et al. |
| 2007/0040204 A1 | 2/2007 | Pulugurtha et al. |
| 2008/0291061 A1 | 11/2008 | Roozeboom et al. |
| 2008/0291601 A1 | 11/2008 | Roozeboom et al. |
| 2010/0238607 A1* | 9/2010 | Park .................. H01G 11/46 216/13 |
| 2011/0073827 A1 | 3/2011 | Rubloff et al. |
| 2012/0057273 A1* | 3/2012 | Haight .................. H01G 11/36 977/948 |
| 2014/0078644 A1* | 3/2014 | Gardner .............. H01G 11/30 29/25.03 |
| 2014/0183694 A1 | 7/2014 | Gardner et al. |
| 2015/0200058 A1* | 7/2015 | Rubloff ............ H01L 29/0676 429/163 |

OTHER PUBLICATIONS

International Search Report issued for PCT/EP2019/062230 dated Jul. 19, 2019.
Written Opinion of the International Searching Authority issued for PCT/EP2019/062230 dated Jul. 19, 2019.

\* cited by examiner

INTEGRATED ENERGY STORAGE
COMPONENT

CROSS REFERENCE TO RELATED APPLICATIONS

The present application is a continuation of International application No. PCT/EP2019/062230, filed May 13, 2019, which claims priority to European Patent Application No. 18305624.1, filed May 18, 2018, the entire contents of each of which are incorporated herein by reference.

FIELD OF THE INVENTION

The present invention relates to the field of integrated energy storage components.

TECHNICAL BACKGROUND

Various technologies have been developed for integrating passive components, such as energy storage components, capacitive devices, etc. in/on substrates such as silicon wafers.

There is a general desire to construct integrated energy storage components that provide a high energy storage density. Various approaches have been tried in this regard. In the case of capacitive devices, conventional approaches for increasing capacitance include reducing the thickness of the dielectric layer (subject to the constraint of avoiding dielectric breakdown when the operating voltage is applied) and selecting a material having high dielectric constant as the material of the dielectric layer.

More recently, proposals have been made to form the conductive layers and dielectric layer of an integrated energy storage component conformally over a contoured surface (i.e. forming the conductive layers and dielectric layer so that their shape conforms to the shape of the underlying surface) rather than employing planar layers. Energy storage components of this type may be referred to as "three-dimensional" components (to differentiate them from planar devices). As an example, the PICS technology proposed by Murata Integrated Passive Solutions employs three-dimensional capacitive components and allows high density capacitive components to be integrated into a silicon substrate.

Recently, three-dimensional capacitive components have been fabricated by embedding a Metal-Insulator-Metal (MIM) structure in a porous anodized material, for example in porous anodized alumina (PAA). This technology provides highly-integrated capacitance which can be used for many applications. This technology implements a capacitive stack (for example a MIM stack, or a MIMIM stack) in a porous structure which is formed above a substrate such as a silicon wafer. The porous structure may result from the anodization of a thin layer of aluminum deposited above the substrate (e.g. deposited on the substrate or deposited on one or more layers which are themselves formed on the substrate). The anodization process converts the Al into alumina, which is porous (PAA). A mask may be formed over the aluminum layer before anodization takes place, so that the anodization process forms islands of porous material).

In prior proposals the Metal-Insulator-Metal structures embedded in PAA typically employ paraelectric dielectric layers (mainly alumina, or hafnium oxide) and two semi-metal or metal electrodes (that are typically made of TiN or Ru or Pt). Pores formed in PAA can have a high aspect ratio (i.e. the pores are elongated but have only small mouths/small cross-sectional area). This produces a confined geometry into which material must be introduced in order to embed the Metal-Insulator-Metal layers of the capacitive components in the pores. As a consequence, atomic layer deposition (ALD) processes are generally used to fabricate the embedded MIM structure. However, even in the case of using an MIM structure having a thin dielectric layer (typically 10 nm) embedded in a PAA structure, the capacitance that can be obtained is not as high as desired: typically, not exceeding areal energy densities of approximately <10 nA·h/mm$^2$.

Proposals have been made to increase the capacitance density of capacitive components by making use of energy storage mechanisms that are different from those usually employed in capacitive components which comprise dielectrics made of paraelectric materials.

For example, U.S. Pat. No. 8,339,768 proposes making use of "pseudocapacitance", that is Faradaic electrochemical reactions, in capacitive components which comprise electrodes made of metal nanotubes (or nanorods) coated by metal oxide, used in conjunction with electrolytic solutions.

Another proposal, making use of so-called "ionic dielectrics", is presented in U.S. Pat. No. 8,830,656. U.S. Pat. No. 8,830,656 proposes planar capacitive components formed on a silicon substrate and employing metal-oxide electrodes used in conjunction with relatively thick, solid ionic dielectrics. The expression "ionic dielectrics" may be used for such materials, even though ionic conduction takes place through them when an electric field is applied, in view of the fact that these materials are located where a capacitor's dielectric layer traditionally is positioned and they are dielectrics with respect to the electrons. They may also be referred to as electronic-insulators ("I" layer) in view of the fact that they are resistant to the flow of electrons.

The paper "An all-in-one nanopore battery array" by Chanyuan Liu, et al, in NATURE NANOTECHNOLOGY 9, 2014, 1031-1039, proposes a three-dimensional energy storage component composed of an array of nanobatteries connected in parallel, each composed of an anode, a cathode and a liquid electrolyte confined within the nanopores of anodic aluminum oxide, as an all-in-one nanosize device.

The above-mentioned battery structure is completed by a first current collector provided on the pore wall and extending down from the top of the pore over a distance of about a third of the height of the pore, and a second current collector provided on the pore wall and extending up from the bottom of the pore over a distance of about a third of the height of the pore (so as to avoid coming into contact with the first current collector; such contact would cause a short circuit). An oxide layer may be provided between each current collector and the electrolyte.

However, the above-described proposals have deficiencies either because they are only suitable for use in limited applications and/or because they still do not achieve as high an energy storage density or as fast charge/discharge or as high charge/discharge current or a sufficiently linear capacitance/voltage relationship as is desired nowadays.

The present invention has been made in the light of the above problems.

SUMMARY OF THE INVENTION

The present invention provides an integrated energy storage component comprising:
a substrate;
a contoured layer supported by the substrate and comprising a region having a contoured surface, the contoured surface of said region being constituted by: elongated pores extending towards the substrate from the surface of the contoured layer remote from the substrate, or elongated columns extending away from the substrate towards the surface of the contoured layer remote from the substrate;

a first M layer extending conformally over the contoured surface of said region, the M layer being conductive of electrons;

a first oxide layer extending conformally over the contoured surface of said region, on the first M layer, this first oxide layer containing ions which are mobile upon application of a potential difference across the first oxide layer;

an I layer extending conformally over the contoured surface of said region, on the first oxide layer, said I layer being an electronic-insulator layer made of an ionic conductor; and a second M layer formed on the I layer, the second M layer being conductive of electrons and extending conformally over the contoured surface of said region;

wherein the first M layer, first oxide layer, I layer and second M layer constitute an MOIM structure.

The present invention further provides an integrated energy storage component comprising:

a substrate;

a contoured layer supported by the substrate and comprising a region having a contoured surface, the contoured surface of said region being constituted by: elongated pores extending towards the substrate from the surface of the contoured layer remote from the substrate, or elongated columns extending away from the substrate towards the surface of the contoured layer remote from the substrate;

a first M layer extending conformally over the contoured surface of said region, the M layer being conductive of electrons;

an I layer extending conformally over the contoured surface of said region, on the first M layer, said I layer being an electronic-insulator layer made of an ionic conductor;

a first oxide layer extending conformally over the contoured surface of said region, on the I layer, this first oxide layer containing ions which are mobile upon application of a potential difference across the first oxide layer;

a second M layer formed on the first oxide layer, the second M layer being conductive of electrons and extending conformally over the contoured surface of said region;

wherein the first M layer, I layer, first oxide layer and second M layer constitute an MIOM structure.

In the integrated energy storage components according to the invention, upon application of a potential difference across the first and second M layers cations of the ionic conductor travel into the adjacent oxide layer (a process which may be referred to as diffusion, intercalation or alloying). Faradic contributions to energy storage are increased at the interface between the oxide and the ionic conductor, or within the oxide. Moreover, there is a high specific area of electrical coupling between the current collector and the ionic conductor. Accordingly, the integrated energy storage component according to the invention provides a high energy storage density. Furthermore, the use of a solid ionic conductor as the "dielectric layer" enables the energy storage component according to the invention to be integrated in/on substrates, thereby increasing the range of applications in which the component can be used.

The integrated component may include a second oxide layer provided between the electronic-insulator layer and the adjacent M layer and extending conformally over the contoured surface of said region. In this case the first M layer, a first one of the oxide layers, electronic-insulator layer, the other oxide layer and second M layer constitute an MOIOM structure.

The ionic conductor may comprise an element which can contribute cations having a degree of ionic mobility sufficient to enable them to travel into the adjacent oxide layer. Examples of suitable elements include, but are not limited to: Li, Na, Mg, K, Cu, Ag, Al and Zn. Elements which have relatively small atomic size tend to provide cations having sufficient ionic mobility.

In the integrated capacitive component, the first M layer may be made of TiN, TaN, or another quasi-metal or metal that conducts electrons. To be concise, the text below refers to M layers as "metal layers" even in a case where such layers are made of a non-metal.

The oxide layers may be made of one or more materials selected in the group consisting of $TiO_2$, $TiO_x$, $TiO_xN_x$, $RuO_2$, $RuO_x$, $NbO_x$, $VO_x$, $WO_x$, $CoO_x$, each comprising, additionally, an atomic proportion of an ionic element present in the ionic dielectric. The expression "atomic proportion" designates a quantity of ions greater than zero, measured as a proportion of the other atoms present in the oxide material.

In the integrated energy storage component according to the invention the oxide layer adjacent to the ionic conductor is pre-loaded with ions. Experimental results show that this initial quantity of ions pre-diffused into the oxide layer is correlated to the quantity of charge that can be stored in the system. In particular, if the oxide layer is not pre-loaded with ions then less energy storage takes place during use of the component. The atomic proportion of the ionic element in the oxide layers may be close or equal to the saturation threshold.

In some embodiments of the invention the ionic conductor may be LiPON, and the cationic species preloaded in the oxide (and travelling into the ionic conductor from the oxide during operation) in this case may be $Li^+$. In such embodiments it may be beneficial for the material of the adjacent oxide to conform to the general formula: $M_xLi_yP_zO_tN_u$. Stoichiometry tends to depend on the element M insofar as it influences the content, at saturation, of Li in the adjacent oxide. Typically, $0<x\leq3$, $0<y\leq4$, $0\leq z\leq1$, $0<t\leq5$, and $0\leq u\leq1$. M is a metal or semiconductor element, Li is lithium, P is phosphorus, O is oxygen and N is nitrogen.

The ionic dielectric layer may be less than 100 nm thick. More preferably the dielectric layer may be less than 50 nm thick.

The ionic dielectric layer may be made of one or more materials selected in the group consisting of: LiPON, $Li_2O$—$Al_2O_3$, $Li_7La_3Zr_2O_{12}$, $LiAlF_4$, and $LiNbO_3$.

The MOIM structure (or MIOM or MOIOM structure), may be repeated, formed conformally over the contoured surface. Thus, for example, an MOIMOIM structure, MIOMIOM structure or MOIOMOIOM structure may be sunk in pores of a porous region, or wrapped over columns. The metal layers of the repeated structure may be connected as a parallel network. In this case the capacitance density scales up in proportion to the number of instances of the repeating structure in the overall stack. The metal layers of the repeated structure may be connected as a serial network. In this configuration the working voltage may be increased.

In an integrated energy storage component wherein the MOIM, MIOM or MOIOM structure is embedded in pores of a porous region, portions of the first metal layer that are located at the bottoms of adjacent pores may be electrically connected to one another by a conductive layer underlying the porous region of the contoured layer. This configuration enables the equivalent series resistance to be reduced.

The present invention further provides a method of fabricating the above integrated energy storage component.

BRIEF DESCRIPTION OF THE DRAWINGS

Further features and advantages of the present invention will become apparent from the following description of certain embodiments thereof, given by way of illustration only, not limitation, with reference to the accompanying drawings in which:

FIGS. 4A and 4B are diagrams illustrating charge storage processes occurring in an MOIM structure employed in embodiments of the invention, in which:

FIG. 4A illustrates a charge redistribution process taking place when applied voltage is less than or equal to a threshold voltage V1, and FIG. 4B illustrates interfacial processes taking place when the applied voltage is greater than the threshold voltage V1

DETAILED DESCRIPTION OF EXAMPLE EMBODIMENTS

Embodiments of the present invention provide an energy storage component designed for improved energy storage. Principles of the present invention will become clear from the following description of certain example embodiments. The example embodiments relate to capacitive components but the skilled person will readily understand that the same principles may be applied in energy storage components of other types.

Furthermore, the example embodiments relate to components in which an MOIM (or MIOM or MOIOM structure) is formed over a porous region and the MOIM structure (or MIOM or MOIOM structure) is embedded in the pores. However, the invention may also be applied in the case where the MOIM, MIOM or MOIOM structure is wrapped conformally over columns.

Figure 1:
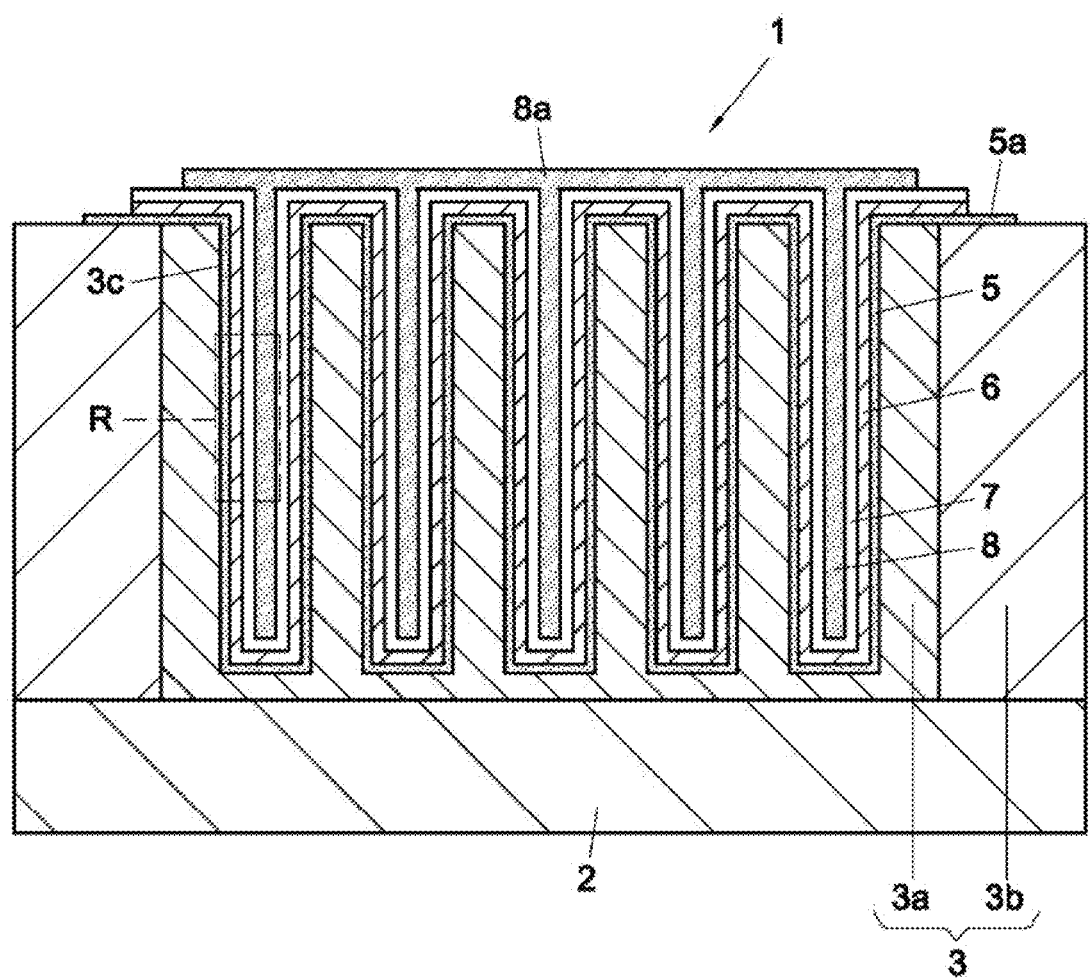
FIG. 1 is a simplified cross-sectional view of a capacitive component according to a first embodiment of the invention.

The structure of a first embodiment of integrated capacitive component according to the invention is illustrated in a simplified manner in FIG. 1.

The capacitive component 1 illustrated in FIG. 1 is integrated on a substrate 2. The substrate may be a raw substrate (i.e., unprocessed) or may have already undergone processing such that other electronic components are already present thereon. The substrate 2 may be made of various materials including, but not limited to: silicon, glass, or a polymer. A contoured layer 3 is formed above the substrate 2. In this example the contoured layer 3 is formed directly on the substrate 2, but intervening layers may be provided between the substrate 2 and the contoured layer 3 (for example as in the third embodiment described below).

The contoured layer 3 has at least one porous region 3a, as well as a region 3b which may be non-porous. In this example the contoured layer 3 is formed by anodization of an aluminum layer; the porous region 3a is formed of porous anodized aluminum (PAA) and the region 3b consists of non-anodized aluminum 3b. The porous region 3a comprises elongated pores 3c extending towards the substrate 2 from the surface of the contoured layer remote from the substrate. In this example the pores 3c are blind holes and have bottoms at the end thereof proximate the substrate 2.

According to the first embodiment of the invention a sandwich MOIM (Metal-Oxide-Ionic dielectric-Metal) structure is embedded in the porous structure. That is, a stack of the following layers is embedded in the pores 3c of the porous region 3a and the shape of each layer conforms to the shape of the underlying layer(s) and pore walls: a first metal layer 5 is formed on the surface of the PAA material of the porous region 3a, a first oxide layer 6 is formed on the first metal layer 5, an ionic dielectric (electronic-insulator) layer 7 is formed on the first oxide layer, and a second metal layer 8 is formed on the ionic dielectric layer 7. As a result of the layer-deposition process, the oxide layer 6 contains ions which are mobile upon application of an electric field across the oxide layer (e.g. in the case where a potential difference is applied across the first and second metal layers 5, 8). The layer 7 is formed of an ionic conductor. Electrical contact to the first and second metal layers 5, 8 may be achieved by providing terminals connected to the surfaces 5a and 8a illustrated in FIG. 1.

Figure 2:
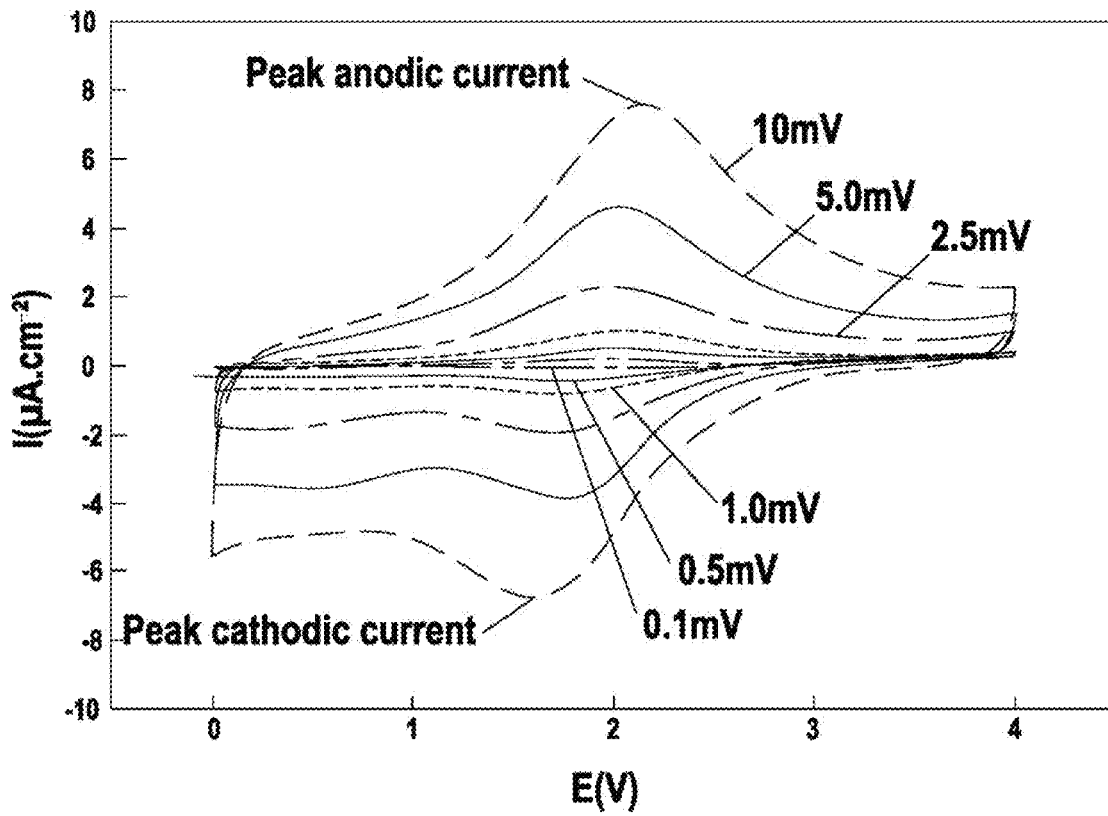
FIG. 2 is a voltammogram showing how current across an MOIM structure varies with applied voltage in a first voltage range.

FIG. 2 shows cyclic voltammetry traces obtained by cyclically ramping up then down the voltage applied to an MOIM stack such as that used in the capacitive component illustrated in FIG. 1. In this example the MOIM structure was formed in a planar, rather than three-dimensional, configuration and consisted of a first Ti metal layer, a LiPON ionic dielectric formed on the first Ti layer, an oxide layer ($TiO_x$) formed by oxidation during reactive deposition of LiPON on Ti, and a second Ti metal layer. The thicknesses of the layers in this example were, as follows: the first Ti layer was 250 nm thick, the LiPON layer was 100 nm thick, the reactive TiOx layer was of the order of 10 nm thick, and the second Ti layer was 250 nm thick.

In the cyclic voltammetry process which gave rise to the results illustrated in FIG. 2, the applied voltage was cycled from 0 volts to 4 volts. Each trace corresponds to a different scan rate (rate of change of voltage). Each trace returns to its point of origin indicating that, when the applied voltage is in the voltage range 0-4 volts, the behavior of the MOIM stack is reversible and so, by inference, the charge storage processes occurring in the stack are reversible over this range of applied voltages.

Figure 3:
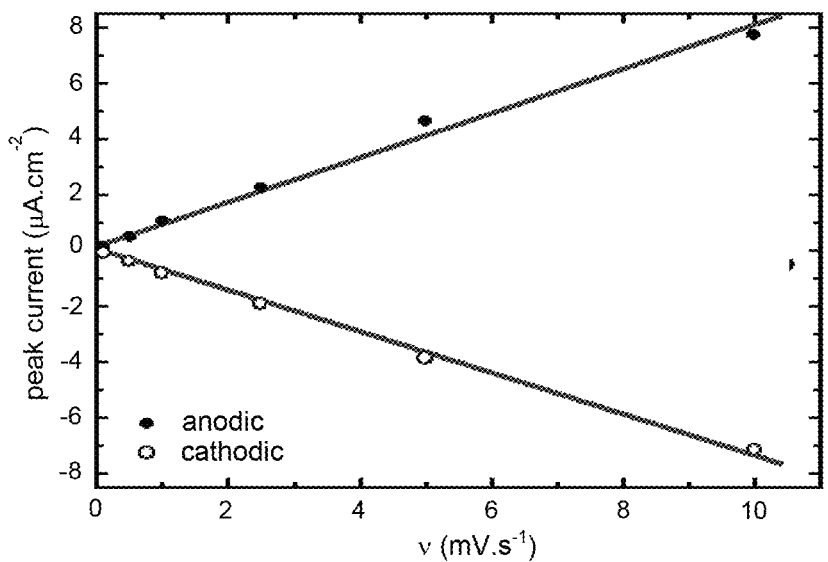
FIG. 3 is a graph showing how peak anodic and cathodic current vary with scan rate in the cyclic voltammetry process illustrated by FIG. 2.

In FIG. 2 the positive-going peak of each trace corresponds to the peak anodic current and the negative-going peak of each trace corresponds to the peak cathodic current. FIG. 3 shows how the peak anodic and cathodic currents vary with the scan rate in the voltammetry traces of FIG. 2.

As can be seen from FIG. 3, the peak current varies linearly with scan rate. Indeed, the results have an excellent fit (R>99%) to the relationship represented by Equation (1) below:

$$i = \frac{dV}{dt} \cdot C_\varphi = v \cdot C_\varphi \qquad (1)$$

So, it is understood that the capacitive current over the applied voltage range of 0-4 volts is due to surface-confined redox processes (so-called pseudocapacitance). Moreover, the capacitance value $C\varphi$ can be estimated at 770 $\mu F \cdot cm^{-2}$. This is 20 times higher than Cdl measured without bias application (Cdl being the double layer capacitance which exists at the interface but which makes a negligible contribution to energy storage).

Figure 4A:
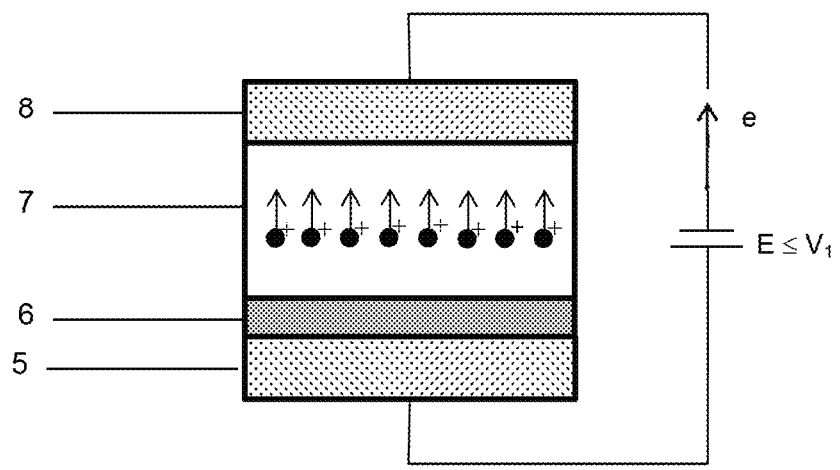
Figure 4B:
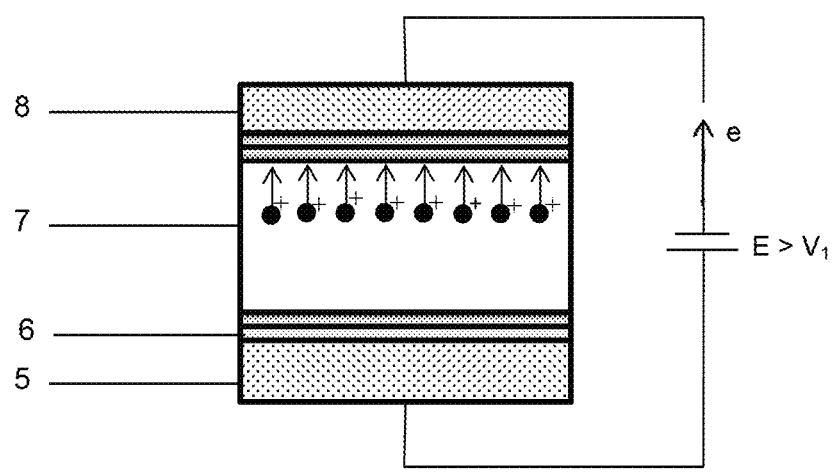

FIGS. 4A and 4B are diagrams illustrating the behavior of the MOIM stack upon application of a voltage across the stack (i.e. a potential difference applied to the first and second metal layers 5, 8). The illustrated regions correspond roughly to the region R marked in FIG. 1.

The travel direction of the cations depends upon the voltage applied across the electrodes. During the charging cycle, one can consider that the negative voltage would be applied on the electrode behind the oxide (thus inserting the $Li^+$ into the oxide), while in the discharge cycle the negative voltage would be applied to the other electrode like it is represented on FIG. 4A (thus migrating the $Li^+$ away from the oxide).

FIG. 4A is a diagram illustrating the behavior of the MOIM stack upon application of a voltage up to a threshold value $V_1$ (e.g. 4 volts in the case illustrated by FIGS. 2 and 3). When the voltage E is applied to the electrodes of the capacitive component (i.e. the first and second metal layers 5,8), positive ions in the ionic dielectric 7 redistribute themselves, accumulation/depletion takes place and pseudo-capacitance reactions account for the component's performance.

However, when a voltage E is applied which is greater than the threshold value $V_1$, an additional phenomenon is observed. Interfacial reactions occur which lead to a supplementary capacitance contribution during discharge. It is understood that the interfacial reactions may include oxidation of the electrodes (first and second metal layers 5 and 8) and/or deposition of positive ions from the ionic dielectric.

The threshold voltage varies dependent on the materials used to constitute the MOIM stack. The value of the threshold voltage is dictated by redox potentials of the integrated materials, usually with respect to a reference electrode. More particularly, it is considered that the voltage is directly related to the potential that is needed in order to initiate the intercalation process (i.e. the oxido-reduction process at both electrodes). Generally, a material is characterized by Vmin and Vmax voltages. The useful potential window can be determined by calculation of potentials for a couple of materials, thus predicting threshold voltage(s).

FIG. 4B is a diagram illustrating the behavior of the MOIM stack upon application of a voltage above the threshold value $V_1$. Upon application of voltages above the threshold value, interfacial reactions take place which contribute supplementary capacitance during discharge. These reactions appear to be reversible.

Although the precise nature of the interfacial reactions has not yet been fully elucidated, it is believed that the reactions may include oxidation of the metal layers and/or deposition of the mobile cation (e.g. $Li^+$). In the example illustrated in FIG. 4B, $Li^+$ ions in the oxide at the interface between Ti and LiPON diffuse further into the oxide and further Li+ ions from the LiPON layer enter the oxide. On the interface at the opposite side of the LiPON layer, there is depletion of Li+ ions as a result of the diffusion. It is believed that a redox reaction takes place at the diffusion plane, producing carrier storage/unstorage depending on the polarity.

Experimental results suggest that the quantity of charge stored in the component correlates to the quantity of ions present in the oxide and/or to the overall thickness of the oxide. Therefore, it is preferred to include in the oxide a large proportion of Li or, more generally, a large proportion of an ion which is going to diffuse into the ionic dielectric during operation. Advantageously, the amount of ions included in the oxide may be close to the maximum concentration, i.e. corresponding to saturation. In the case here the oxide is pre-loaded with ions at a concentration which is at or close to the saturation threshold, superior charge-storage performance is achieved.

The MOIM structure 5-8 embedded in the pores of the porous region 3a of the contoured layer 3 of the capacitive component 1 maximizes the surface area over which the charge storage mechanism takes place. Accordingly, this capacitive component can achieve a high capacitance density.

In a variant of the first embodiment, the positions of the electronic-insulator layer and oxide layer are reversed, so that the electronic-insulator layer is formed on the first metal layer, the first oxide layer is formed on the electronic-insulator layer and the second metal layer is formed on the first oxide layer, producing a MIOM structure. The remarks above regarding the first embodiment (materials for the various layers, the behavior upon application of an electric field, etc.) apply also to the MIOM structure according to the variant of the first embodiment.

In a second embodiment of the invention an additional oxide layer (not shown) is provided between the ionic dielectric layer 7 and the second metal layer 8. Thus, in the second embodiment, an MOIOM stack is embedded in the pores 3c of the porous region 3a. As for the first embodiment of the invention, high capacitance density is achieved with a structure according to the second embodiment and the same types of charge storage mechanisms are exploited.

In an MOIOM stack in a component according to the second embodiment, when a voltage is applied across the component, ion exchange phenomena between the ionic conductor layer (I layer) and both of the oxide layers (both O layers) take place simultaneously.

In certain embodiments of the invention the porous material in which the MOIM/MIOM/MOIOM stack is embedded may be electrically conductive.

In certain other embodiments of the invention the porous structure in which the MOIM/MIOM/MOIOM stack is embedded may be made of an insulating material.

Figure 5:
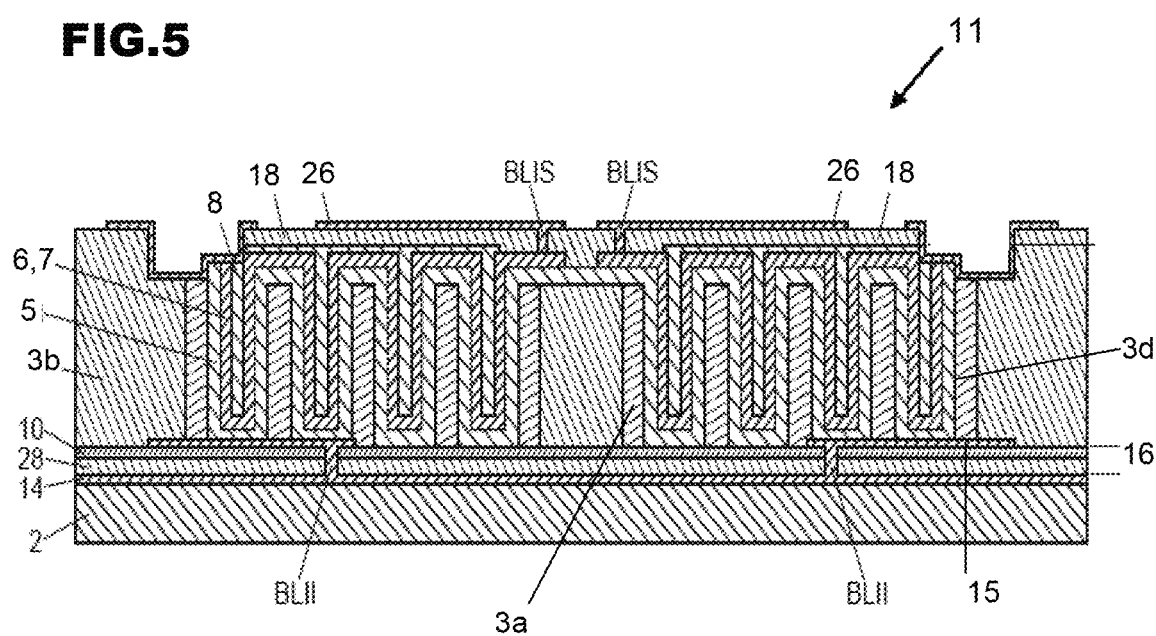
FIG. 5 illustrates an example of a capacitive component according to a third embodiment of the invention.

FIG. 5 illustrates a capacitive component 11 according to a third embodiment of the invention. In the third embodiment the MOIM stack, or MIOM stack, or MOIOM stack, is embedded in pores 3d in an insulating material. In this embodiment more than 70% of the pores of the porous structure having their bottoms open so that the pores 3d define through-holes. For reasons of restricted space, in FIG. 5 a single layer is drawn to represent the oxide layer and ionic dielectric layer 6, 7 of the MOIM structure.

In this embodiment a conductive stack 16 is provided between the substrate 2 and the contoured layer 3, and the first metal layer 5 of the MOIM (or MIOM or MOIOM) stack makes contact with the conductive stack 16 at locations corresponding to the bottoms of the pores. With this configuration the conductive stack 16 serves as a bottom collector and the equivalent series resistance of the capacitive component is reduced.

In the example illustrated in FIG. 5 the conductive stack 16 comprises a highly-conductive layer 28 and a barrier layer 10. The barrier layer 10 serves to protect the metal layer 28 during the process of opening the bottoms of the pores and is itself reasonably conductive (so as not to detract from the function of stack 16 as a first electrode of the capacitive component). The barrier layer 10 may be made of a material such as tungsten or titanium which forms a stable oxide during anodization of the metal which is anodized to form the porous region 3a of the contoured layer 3. Thus, the anodization process may be continued sufficiently long to open the bottoms of the pores and the oxide formed in the barrier layer prevents damage to the underlying metal layer 28. The barrier layer oxide may be removed, for example using a selective etchant which does not damage the anodized material of the porous region 3a.

In the example illustrated in FIG. 5 a conductive material 18 is provided above the capacitive component 11 and makes electrical contact with the second metal layer 8.

An insulating layer 14 is provided on the substrate 2. More of this same insulating material fills lower isolation grooves BLII which are formed in the conductive stack 16 and further portions 15 of the insulating material underlie groups of the pores 3d. In a similar way, insulating material 16 overlies portions of the conductive material 18 and fills upper isolation grooves BLIS. By providing these isolation features, plural instances of the structure illustrated in FIG. 5 can be stacked one on top of the other, with the capacitive component(s) of a lower instance being electrically connected to the capacitive component(s) of the superposed instance.

In the example illustrated in FIG. 5 the porous structure may have pores having pore diameter and pitch which are nearly uniform over the porous region 3a. The pore diameter may be in the range of 80-300 nm+/−20% variation and the pore pitch may be in the range of 120 to 500 nm.

In a fourth embodiment of the invention a repeated MOIM stack structure (e.g. an MOIMOIM stack) is embedded in the pores of the porous region of a contoured layer provided above a substrate.

In a fifth embodiment of the invention a repeated MIOM stack structure (e.g. an MIOMIOM stack) is embedded in the pores of the porous region of a contoured layer provided above a substrate.

In a sixth embodiment of the invention a repeated MOIOM stack structure (e.g. an MOIOMOIOM stack) is embedded in the pores of the porous region of a contoured layer provided above a substrate.

In capacitive components according to the fourth, fifth and sixth embodiments, the M electrodes may be connected as a parallel network. In such cases the capacitance density scales up proportionally to the number of repeats of the basic MOIM (or MIOM or MOIOM) structure.

In capacitive components according to the fourth, fifth and sixth embodiments, the M electrodes may be connected as a serial network. In such cases the working voltage can be increased.

In the first to sixth embodiments of the invention various ionic dielectrics may be used including, but not limited to: LiPON, $Li_2O$—$Al_2O_3$, $Li_7La_3Zr_2O_{12}$, $LiAlF_4$, $LiNbO_3$, etc. In certain preferred implementations of the first to sixth embodiments of the invention the thickness of the ionic dielectric (I) layer is less than 100 nm. In certain more preferred implementations of the first to sixth embodiments of the invention the thickness of the ionic dielectric (I) layer is less than 50 nm. In view of the fact that the energy storage mechanism is believed to take place in the oxide layer that has been pre-loaded with ions, it is possible to reduce the thickness of the ionic dielectric layer below 50 nm and, thus, an MOIM or MIOM or MOIOM stack according to the invention can be embedded in pores which are just 100 nm in diameter. In such a case, superior charge-storage density is obtained.

The MOIM, MIOM or MOIOM layers may be formed by any suitable process, for example by atomic layer deposition (ALD).

In certain preferred implementations of the first to sixth embodiments of the invention the first and second metal layers 5, 8 are formed of TiN layers or layers of other quasi-metals (TaN, etc.) or metals (Ti, Ta, Co etc. . . . ). Each of the first and second metal layers 5, 8 may have a thickness that is less than 30 nm.

In certain preferred implementations of the first to sixth embodiments of the invention the interfacial oxide (O) layer 6 is formed of a material selected in the group consisting of: $TiO_2$, $TiO_x$, $TiO_xN_x$, $RuO_2$, $RuO_x$, $NbO_x$, $VO_x$, $WO_x$, $CoO_x$). The oxide layer may have a thickness greater than 5 nm and may comprise an atomic proportion of the same ionic element as the ionic element in the ionic dielectric, for example Li, Na, Mg etc. Multiple ionic species may be provided.

In certain preferred implementations of the first to sixth embodiments of the invention the ionic conductor may be LiPON, and the ions pre-loaded into the adjacent oxide may be $Li^+$. In such embodiments it may be beneficial for the material of the adjacent oxide to conform to the general formula: $M_xLi_yP_zO_tN_u$, where M is a metal or semiconductor element, Li is lithium, P is phosphorus, O is oxygen, N is nitrogen, $0 < x \leq 3$, $0 < y \leq 4$, $0 \leq z \leq 1$, $0 \leq t \leq 5$, and $0 \leq u \leq 1$. In certain preferred implementations of the first to sixth embodiments of the invention the atomic proportion of the ionic element in the interfacial (O) layer is close to, or equal to, the saturation threshold. For a given oxide(O)/ionic element this threshold corresponds to the maximum theoretical rate of the ionic element that can be integrated into the host material, expressed as a concentration ratio of moles of the ionic element per mole of the host material. For example 1 mole of lithium can be inserted in one mole of amorphous $TiO_2$, corresponding to a saturation threshold of 1 leading to a composition stoichiometry of $LiTiO_2$.

Various techniques may be used for pre-loading ions in the interfacial oxide layer 6 including, but not limited to, the following examples: drive-in during early stages in formation of the LiPON layer resulting from the thermal budget and/or reactive oxide surface; co-deposition during the oxide deposition process; and so on.

Additional Variants

Although the present invention has been described above with reference to certain specific embodiments, it will be understood that the invention is not limited by the particularities of the specific embodiments. Numerous variations, modifications and developments may be made in the above-described embodiments within the scope of the appended claims.

For example, although the figures show components in which the porous regions of the contoured layer consist solely of porous anodized material, it will be understood that some residual unanodized material could remain between the individual pores.

As another example, although the description above refers to a contoured layer comprising aluminum and regions of porous anodized alumina it is to be understood that other anodizable materials may be used to form the contoured layer. Furthermore, anodization may produce hydroxides as well as oxides.

As yet another example, although the third embodiment illustrated in FIG. 5 shows an MOIM structure embedded in the pores, the embedded structure could be a MIOM structure, an MOIOM structure, a repeated MOIM structure, a repeated MIOM structure or a repeated MOIOM structure.

The invention claimed is:

1. An integrated energy storage component comprising:
a substrate;
a contoured layer supported by the substrate and comprising a region having a contoured surface, the contoured surface of said region having elongated pores extending towards the substrate from the surface of the contoured layer remote from the substrate, or elongated columns extending away from the substrate towards the surface of the contoured layer remote from the substrate;
a first M layer extending conformally over the contoured surface of said region, the first M layer being conductive of electrons;
a first oxide layer extending conformally over the contoured surface of said region, on the first M layer, said oxide layer having therein ions which are mobile upon application of a potential difference across the first oxide layer;
an I layer extending conformally over the contoured surface of said region, on the first oxide layer, said I layer being an electronic-insulator layer made of an ionic conductor; and
a second M layer on the I layer, the second M layer being conductive of electrons and extending conformally over the contoured surface of said region,
wherein the first M layer, the first oxide layer, the I layer and the second M layer are stacked in direct contact to constitute an MOIM structure, and
wherein the first oxide layer is made of one or more materials selected from the group consisting of $TiO_2$, $TiO_x$, $TiO_xN_y$, $RuO_2$, $RuO_x$, $NbO_x$, $VO_x$, $WO_x$, $CoO_x$, or is made of $M_xLi_yP_zO_tN_u$, where M is a metal or semiconductor element, Li is lithium, P is phosphorus, O is oxygen, N is nitrogen, $0<x\leq3$, $0<y\leq4$, $0\leq z\leq1$, $0<t\leq5$, and $0\leq u\leq1$.

2. The integrated energy storage component of claim 1, wherein the ionic conductor comprises ions of an element selected from the group comprising: Li, Na, Mg, K, Cu, Ag, Al and Zn.

3. The integrated energy storage component of claim 1, wherein the first M layer is made of TiN, TaN, or another quasi-metal or metal.

4. The integrated energy storage component of claim 1, wherein the first oxide layer comprises an atomic proportion of the ion present in the ionic conductor.

5. The integrated energy storage component of claim 1, wherein the ionic conductor is LiPON, and the first oxide layer is made of the $M_xLi_yP_zO_tN_u$.

6. The integrated energy storage component of claim 4, wherein the atomic proportion of the ionic element in the first oxide layer is close or equal to a saturation threshold thereof.

7. The integrated energy storage component of claim 1, wherein the electronic-insulator layer is less than 100 nm thick.

8. The integrated energy storage component of claim 1, wherein the electronic-insulator layer is made of one or more materials selected from the group consisting of: LiPON, $Li_2O$—$Al_2O_3$, $Li_7La_3Zr_2O_{12}$, $LiAlF_4$, and $LiNbO_3$.

9. The integrated energy storage component of claim 1, wherein a repeated MOIM structure is provided conformally over the contoured surface of said region.

10. The integrated energy storage component of claim 9, wherein the first and second M layers of the repeated structure are connected as a parallel network.

11. The integrated energy storage component of claim 9, wherein the first and second M layers of the repeated structure are connected as a serial network.

12. The integrated energy storage component of claim 1, wherein the contoured region is a porous region and portions of the first M layer that are located at bottoms of adjacent pores are electrically connected to one another by a conductive layer underlying the porous region of the contoured layer.

13. An integrated energy storage component comprising:
a substrate;
a contoured layer supported by the substrate and comprising a region having a contoured surface, the contoured surface of said region having elongated pores extending towards the substrate from the surface of the contoured layer remote from the substrate, or elongated columns extending away from the substrate towards the surface of the contoured layer remote from the substrate;
a first M layer extending conformally over the contoured surface of said region, the first M layer being conductive of electrons;
an I layer extending conformally over the contoured surface of said region, on the first M layer, said I layer being an electronic-insulator layer made of an ionic conductor;
a first oxide layer extending conformally over the contoured surface of said region, on the I layer, said oxide layer having therein ions which are mobile upon application of a potential difference across the first oxide layer; and
a second M layer formed on the first oxide layer, the second M layer being conductive of electrons and extending conformally over the contoured surface of said region,
wherein the first M layer, the I layer, the first oxide layer, and the second M layer are stacked in direct contact to constitute an MIOM structure, and
wherein the first oxide layer is made of one or more materials selected from the group consisting of $TiO_2$, $TiO_x$, $TiO_xN_y$, $RuO_2$, $RuO_x$, $NbO_x$, $VO_x$, $WO_x$, $CoO_x$, or is made of $M_xLi_yP_zO_tN_u$, where M is a metal or semiconductor element, Li is lithium, P is phosphorus, O is oxygen, N is nitrogen, $0<x\leq3$, $0<y\leq4$, $0\leq z\leq1$, $0<t\leq5$, and $0\leq u\leq1$.

14. The integrated energy storage component of claim 13, wherein the ionic conductor comprises ions of an element selected from the group comprising: Li, Na, Mg, K, Cu, Ag, Al and Zn.

15. The integrated energy storage component of claim 13, wherein the first M layer is made of TiN, TaN, or another quasi-metal or metal.

16. The integrated energy storage component of claim 13, wherein the first oxide layer comprises an atomic proportion of the ion present in the ionic conductor.

17. The integrated energy storage component of claim 13, wherein the ionic conductor is LiPON, and the first oxide layer is made of the $M_xLi_yP_zO_tN_u$.

18. The integrated energy storage component of claim 16, wherein the atomic proportion of the ionic element in the first oxide layer is close or equal to a saturation threshold thereof.

19. The integrated energy storage component of claim 13, wherein the electronic-insulator layer is less than 100 nm thick.

20. The integrated energy storage component of claim 13, wherein the electronic-insulator layer is made of one or more materials selected from the group consisting of: LiPON, $Li_2O$—$Al_2O_3$, $Li_7La_3Zr_2O_{12}$, $LiAlF_4$, and $LiNbO_3$.

21. The integrated energy storage component of claim 13, wherein a repeated MIOM structure is provided conformally over the contoured surface of said region.

22. The integrated energy storage component of claim 21, wherein the first and second M layers of the repeated structure are connected as a parallel network.

23. The integrated energy storage component of claim 21, wherein the first and second M layers of the repeated structure are connected as a serial network.

24. The integrated energy storage component of claim 13, wherein the contoured region is a porous region and portions of the first M layer that are located at bottoms of adjacent pores are electrically connected to one another by a conductive layer underlying the porous region of the contoured layer.

* * * * *